(12) United States Patent
Stephan et al.

(10) Patent No.: US 9,810,452 B2
(45) Date of Patent: *Nov. 7, 2017

(54) WEAR REDUCTION SYSTEM FOR ROOFTOP MOUNTS

(71) Applicant: Pegasus Solar Inc., Richmond, CA (US)

(72) Inventors: Erich Kai Stephan, Newport Beach, CA (US); Eric R. Stephan, Gig Harbor, WA (US)

(73) Assignee: PEGASUS SOLAR INC., Richmond, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/007,099

(22) Filed: Jan. 26, 2016

(65) Prior Publication Data

US 2016/0138833 A1    May 19, 2016

Related U.S. Application Data

(62) Division of application No. 14/018,299, filed on Sep. 4, 2013, now Pat. No. 9,252,310.

(Continued)

(51) Int. Cl.
*F24J 2/52* (2006.01)
*H01L 31/049* (2014.01)
(Continued)

(52) U.S. Cl.
CPC ............... *F24J 2/523* (2013.01); *F16B 17/00* (2013.01); *F16M 13/02* (2013.01); *F24J 2/5205* (2013.01); *F24J 2/5235* (2013.01); *F24J 2/5237* (2013.01); *F24J 2/5239* (2013.01); *F24J 2/5241* (2013.01); *F24J 2/5245* (2013.01); *H01L 31/048* (2013.01); *H01L 31/049* (2014.12); *H01L 31/18* (2013.01); *H02S 20/00* (2013.01); *H02S 20/23* (2014.12); *H02S 20/24* (2014.12); *H02S 20/30* (2014.12);
(Continued)

(58) Field of Classification Search
CPC ........ F24J 2/5245; F24J 2/5235; F24J 2/5241; F24J 2/5205; F24J 2/253; F24J 2/5237; F24J 2/5239; H02S 20/23; H02S 20/24; H01L 31/049; F16M 13/02
See application file for complete search history.

(56) References Cited

U.S. PATENT DOCUMENTS 3,370,873 A     2/1968   Holton
4,421,943 A    12/1983   Withjack
(Continued)

FOREIGN PATENT DOCUMENTS

CH    FR 2959520 A1 *  11/2011  ............. F24J 2/5245
CN         101256413         9/2008
(Continued)

OTHER PUBLICATIONS

International Search Report and Written Opinion dated Feb. 7, 2014, for PCT Application No. PCT/US2013/058073 (10 pages).

(Continued)

*Primary Examiner* — Eret McNichols
(74) *Attorney, Agent, or Firm* — Polsinelli LLP

(57) ABSTRACT

A building rooftop mounting structure including a sacrificial material that allows freedom of movement between itself and the rooftop as well as between itself and the mounting structure.

16 Claims, 9 Drawing Sheets

Related U.S. Application Data

(60) Provisional application No. 61/632,412, filed on Sep. 4, 2012, provisional application No. 61/699,546, filed on Sep. 11, 2012.

(51) Int. Cl.
    | | | |
    |---|---|---|
    | *F16B 17/00* | (2006.01) | |
    | *H01L 31/18* | (2006.01) | |
    | *H02S 20/00* | (2014.01) | |
    | *H01L 31/048* | (2014.01) | |
    | *H02S 20/23* | (2014.01) | |
    | *F16M 13/02* | (2006.01) | |
    | *H02S 20/30* | (2014.01) | |
    | *H02S 20/24* | (2014.01) | |

(52) U.S. Cl.
    CPC ............... *Y02B 10/12* (2013.01); *Y02B 10/20* (2013.01); *Y02E 10/47* (2013.01); *Y02E 10/50* (2013.01); *Y10T 29/49355* (2015.01); *Y10T 29/49826* (2015.01)

(56) References Cited

U.S. PATENT DOCUMENTS

| | | | |
|---|---|---|---|
| 5,746,029 A | 5/1998 | Ullman | |
| 6,242,685 B1 | 6/2001 | Mizukami et al. | |
| 6,360,491 B1 | 3/2002 | Ullman | |
| 6,773,780 B2* | 8/2004 | Hutter, III | F16B 5/0208 |
| | | | 403/267 |
| 7,406,800 B2 | 8/2008 | Cinnamon et al. | |
| 7,574,842 B2 | 8/2009 | Russell | |
| 7,592,537 B1 | 9/2009 | West | |
| 7,762,027 B1 | 7/2010 | Wentworth et al. | |
| 7,832,157 B2 | 11/2010 | Cinnamon | |
| 7,866,098 B2 | 1/2011 | Cinnamon | |
| 7,895,808 B1 | 3/2011 | Wentworth et al. | |
| 7,905,064 B1 | 3/2011 | Wentworth et al. | |
| 7,987,641 B2 | 8/2011 | Cinnamon | |
| 8,092,129 B2 | 1/2012 | Wiley et al. | |
| 8,109,048 B2 | 2/2012 | West et al. | |
| 8,153,700 B2 | 4/2012 | Stearns et al. | |
| 8,166,713 B2 | 5/2012 | Stearns et al. | |
| 8,245,459 B2 | 8/2012 | Belikoff et al. | |
| 8,353,650 B2 | 1/2013 | Wiley et al. | |
| 8,375,654 B1 | 2/2013 | West et al. | |
| 8,505,248 B1 | 8/2013 | Leong et al. | |
| 8,557,070 B2* | 10/2013 | Stanley | F24F 3/0442 |
| | | | 156/291 |
| 8,608,418 B2 | 12/2013 | Wiley et al. | |
| 8,623,158 B2* | 1/2014 | Stanley | E04D 13/1407 |
| | | | 156/291 |
| 8,733,037 B2 | 5/2014 | Bindschedler et al. | |
| 8,752,343 B2* | 6/2014 | Kuan | H01L 31/0422 |
| | | | 248/237 |
| 8,756,881 B2 | 6/2014 | West et al. | |
| 8,813,460 B2 | 8/2014 | Cinnamon et al. | |
| 8,850,756 B1 | 10/2014 | Anderson et al. | |
| 8,875,455 B1 | 11/2014 | Yang et al. | |
| 8,893,445 B2 | 11/2014 | Yen | |
| 8,966,838 B2* | 3/2015 | Jenkins | H02S 20/25 |
| | | | 136/244 |
| 9,103,122 B2* | 8/2015 | Boss | E04D 5/06 |
| 9,130,089 B2 | 9/2015 | Bindschedler et al. | |
| 9,136,792 B2* | 9/2015 | Tomlinson | H02S 20/00 |
| 9,184,309 B2 | 11/2015 | Baumbach et al. | |
| 9,249,925 B2* | 2/2016 | Roensch | H01L 31/042 |
| 9,252,310 B2 | 2/2016 | Stephan et al. | |
| 9,416,544 B2* | 8/2016 | James | E04D 13/14 |
| 2007/0144575 A1 | 6/2007 | Mascolo et al. | |
| 2008/0245404 A1 | 10/2008 | DeLiddo | |
| 2008/0265112 A1* | 10/2008 | Pascual | H02G 3/32 |
| | | | 248/176.1 |
| 2009/0078299 A1 | 3/2009 | Cinnamon et al. | |
| 2009/0114270 A1 | 5/2009 | Stancel | |
| 2009/0223553 A1 | 9/2009 | Thoroughgood | |
| 2009/0255201 A1 | 10/2009 | Kraus, Jr. et al. | |
| 2010/0089390 A1 | 4/2010 | Miros et al. | |
| 2010/0236541 A1 | 9/2010 | Smith et al. | |
| 2010/0243023 A1 | 9/2010 | Patton et al. | |
| 2010/0307074 A1 | 12/2010 | Stearns et al. | |
| 2011/0041429 A1 | 2/2011 | Rummens et al. | |
| 2011/0162779 A1* | 7/2011 | Stanley | F24F 3/0442 |
| | | | 156/66 |
| 2011/0240101 A1 | 10/2011 | Sagayama et al. | |
| 2011/0240207 A1* | 10/2011 | Stanley | E04D 13/1407 |
| | | | 156/91 |
| 2012/0048351 A1 | 3/2012 | Rizzo | |
| 2012/0085041 A1 | 4/2012 | Place | |
| 2012/0110931 A1 | 5/2012 | Eiffert et al. | |
| 2012/0233958 A1 | 9/2012 | Stearns | |
| 2012/0298817 A1 | 11/2012 | West et al. | |
| 2013/0160824 A1 | 6/2013 | Khouri et al. | |
| 2013/0291472 A1 | 11/2013 | Sader | |
| 2013/0299659 A1 | 11/2013 | Sader | |
| 2014/0060626 A1 | 3/2014 | Stephan et al. | |
| 2014/0083504 A1 | 3/2014 | Kuo | |
| 2014/0109953 A1 | 4/2014 | Aulich | |
| 2014/0169909 A1 | 6/2014 | Wiley et al. | |
| 2014/0174511 A1 | 6/2014 | West et al. | |
| 2014/0182663 A1 | 7/2014 | Kuo et al. | |
| 2014/0238464 A1 | 8/2014 | Vesborg | |
| 2014/0299179 A1 | 10/2014 | West et al. | |
| 2014/0331594 A1* | 11/2014 | Stearns | H01Q 1/1207 |
| | | | 52/705 |
| 2015/0040969 A1 | 2/2015 | Wildes | |
| 2015/0052834 A1 | 2/2015 | Gies et al. | |
| 2015/0204584 A1 | 7/2015 | Ramos | |
| 2016/0109054 A1* | 4/2016 | Pantel | F16M 13/02 |
| | | | 248/121 |

FOREIGN PATENT DOCUMENTS

| | | |
|---|---|---|
| CN | 201344657 | 11/2009 |
| CN | 102084497 | 6/2011 |
| CN | 201947205 | 8/2011 |
| DE | 102006022455 | 11/2007 |
| EP | 1039550 | 9/2000 |
| FR | 2956423 | 8/2011 |
| JP | S60-173252 | 9/1985 |
| JP | H10-168897 | 6/1998 |
| JP | 2006-278481 | 10/2006 |
| JP | 2009-130183 | 6/2009 |
| JP | 2012001909 A * | 1/2012 |
| WO | WO 2005/057092 | 6/2005 |
| WO | WO 2012/004542 | 1/2012 |

OTHER PUBLICATIONS

International Search Report and Written Opinion dated Feb. 3, 2014, for PCT Application No. PCT/US2013/058076 (10 pages).
Extended European Search Report dated Mar. 2, 2016, for EP Application No. 13835455.0, 7 pages.
Extended European Search Report dated Jun. 1, 2016, for EP Application No. 13835874.8, 8 pages.
Communication pursuant to Article 64(3) EPC by the European Patent Office for application No. EP13835455.0, dated Apr. 28, 2017, 4 pages.
Machine generated English translation of the Reasons for Refusal by the Japan Patent Office for application No. JP 2015-531164, dated May 16, 2017, 3 pages.
Machine generated English translation of the First Office Action by The State Intellectual Property Office of People's Republic of China for application No. CN201380056733.0, dated Sep. 30, 2016, 6 pages.
Machine generated English translation of the First Office Action by The State Intellectual Property Office of People's Republic of China for application No. CN201380056437.0, dated Jun. 30, 2016, 8 pages.

* cited by examiner

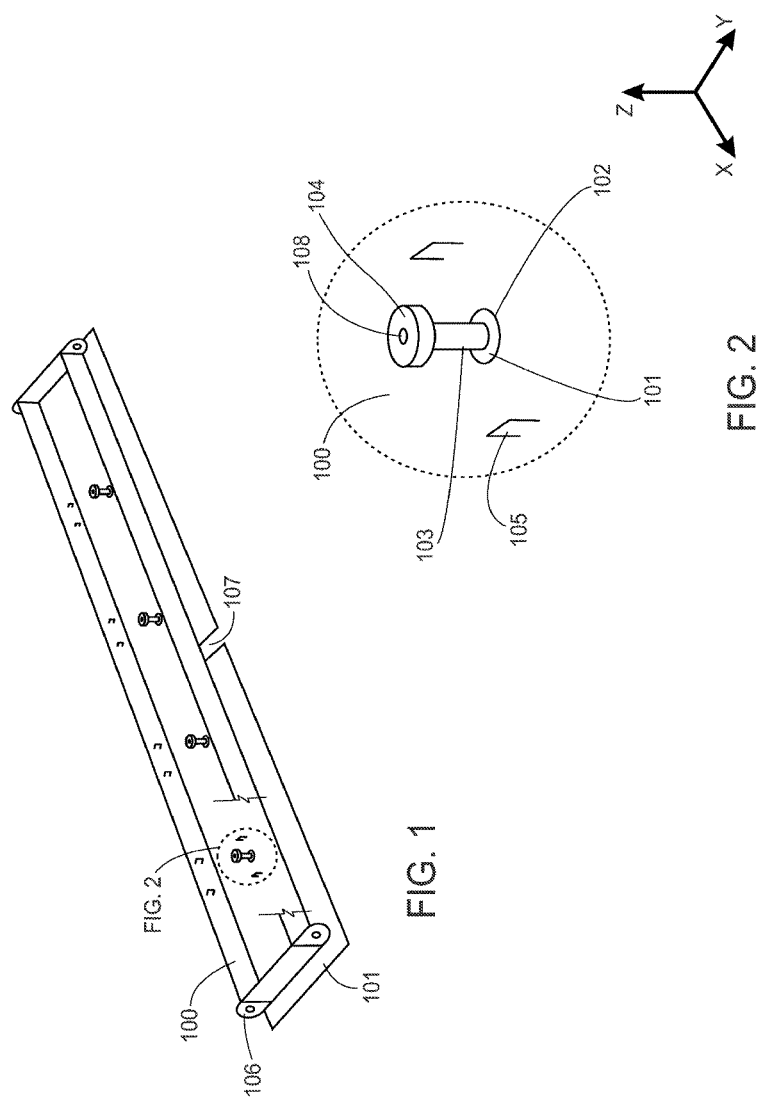

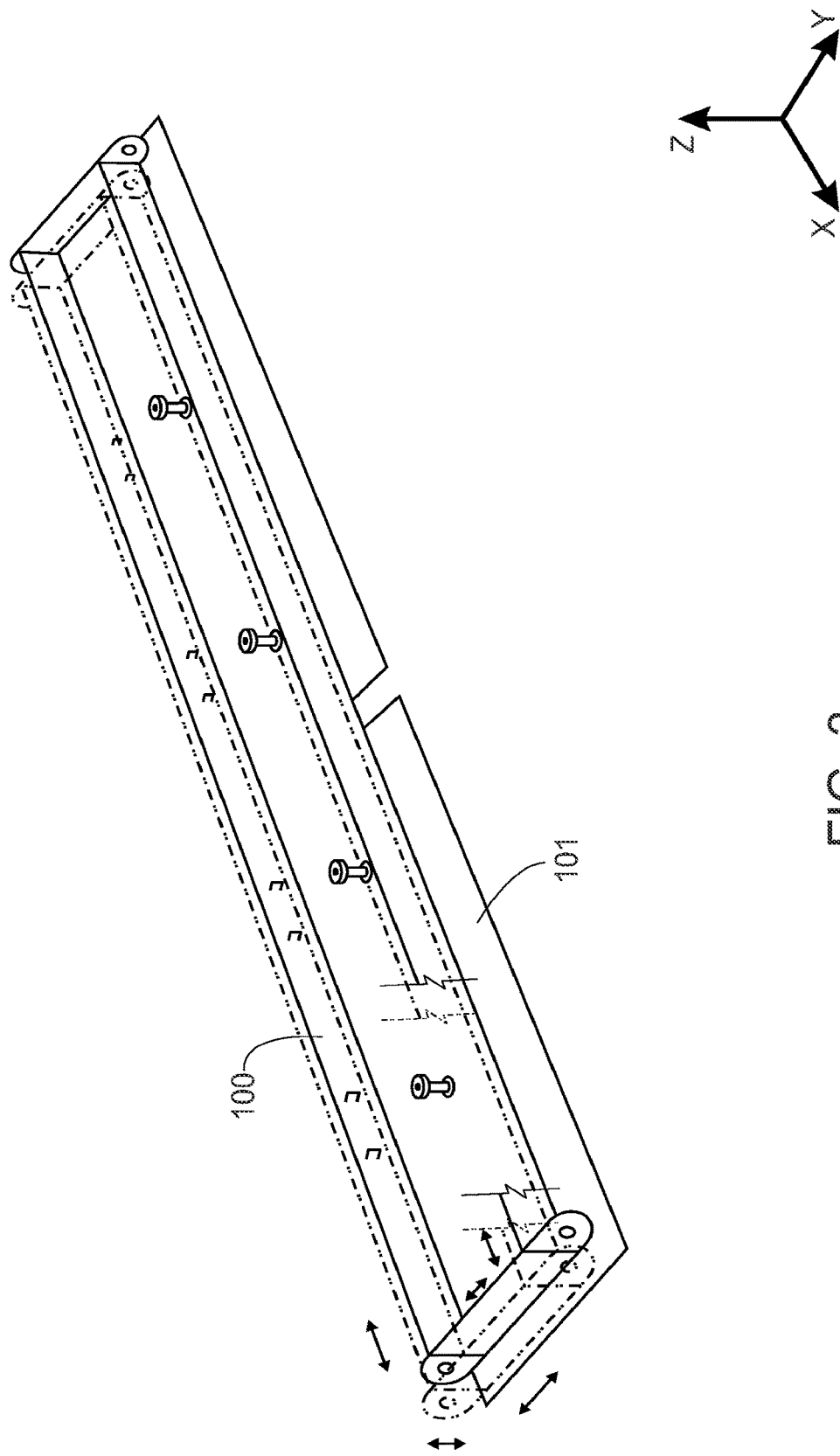

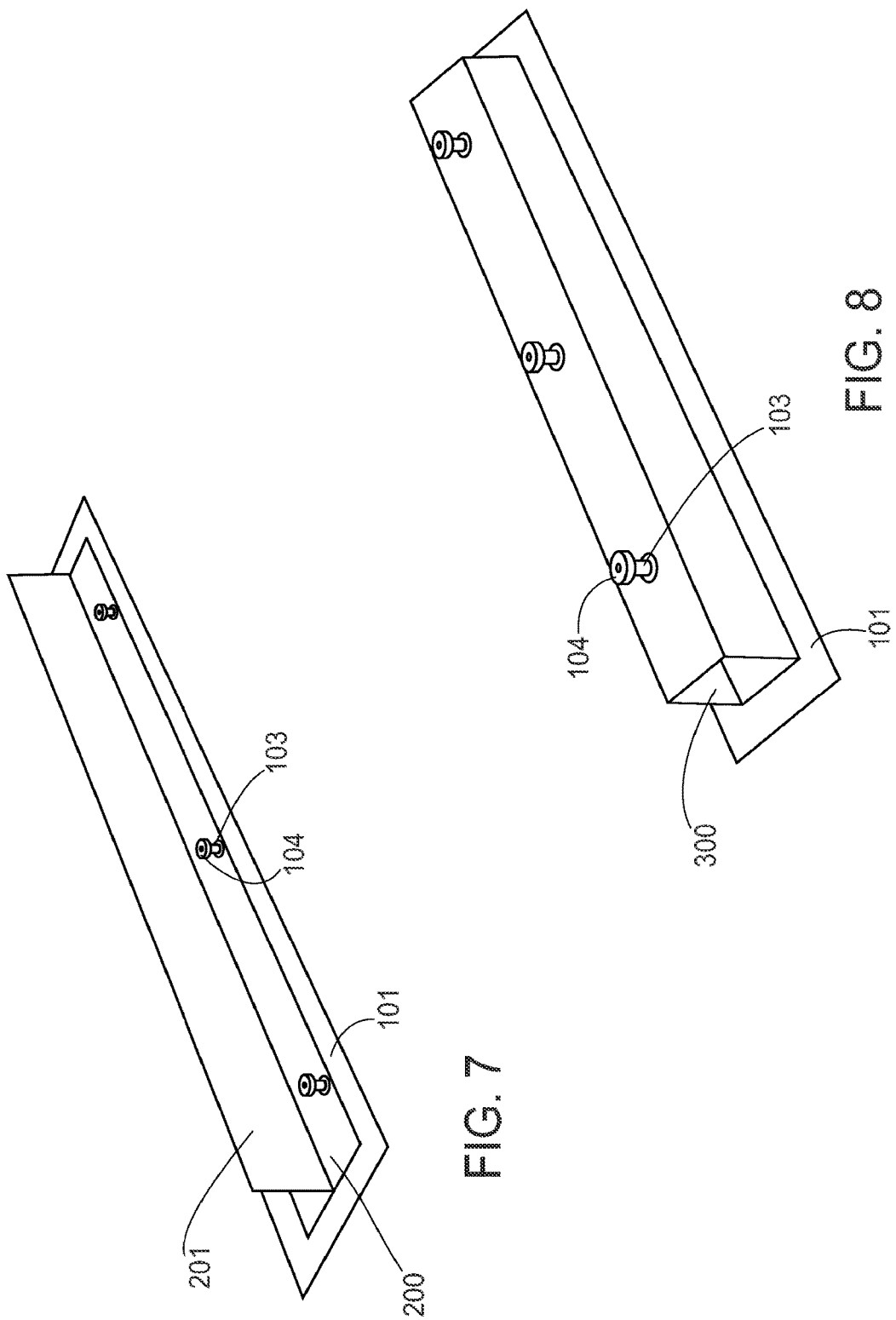

WEAR REDUCTION SYSTEM FOR ROOFTOP MOUNTS

CROSS-REFERENCE TO RELATED APPLICATIONS

This application is a divisional of U.S. patent application Ser. No. 14/018,299, filed on Sep. 4, 2013, which claims the benefit of U.S. Provisional Patent Application No. 61/632,412, filed on Sep. 4, 2012 and U.S. Provisional Patent Application No. 61/699,546, filed on Sep. 11, 2012, the disclosures of which are incorporated herein by reference in their entirety.

BACKGROUND

Many embodiments of the invention relate to mounting structures for solar energy panels on building rooftops. Such solar panels may include photovoltaic panels, solar thermal panels among other solar capture devices.

As rooftop solar energy systems become more popular for building owners and occupants, many wish to install them on their roof. In order to reduce or eliminate roof penetrations, which increase the risk of roof leaks, a ballasted system is often used to hold the solar energy panel array on the building rooftop. The weight of the ballast and system itself hold the solar energy panel array in place against wind load, small building movements, etc. Ballasted systems typically employ a metal tray placed directly on the roof membrane, with concrete bricks placed in the tray as ballast. Since the ballast tray often rests directly on the roof membrane, the ballast tray and other mounting components rub against the roof membrane during small building vibrations, small vibrations of the panels from wind, and differing thermal expansion rates between the building and solar energy mounting system. Over time, this friction can wear a hole through the roof membrane and cause leakage into the building. To counter this problem, many roofing manufacturers require a "slip sheet", or sacrificial material be placed between the roof membrane and any roof mounting component not mechanically secured, such as a ballast tray for a photovoltaic system.

BRIEF SUMMARY OF THE INVENTION

Many embodiments are related to an integrated sacrificial material that is mechanically connected to the rooftop mounting structure while allowing some freedom of movement between both the building rooftop and the sacrificial material, and the sacrificial material and the mounting structure. The sacrificial material may be connected to the mounting structure such that when the mounting structure is picked up and moved, as in from a loading pallet to the installation site, the sacrificial material stays connected to the mounting structure. When the mounting structure is placed on the roof membrane, no separate installation of the sacrificial material is required for many embodiments. The sacrificial material may be pre-installed, i.e. at the factory, on the mounting structure.

The sacrificial material allows freedom of movement between itself and the mounting structure. The sacrificial material can be attached to the mounting structure in such a way that the mounting structure can move a limited distance in all spatial directions without moving the sacrificial material, thus significantly reducing wear between the roof membrane and the mounting structure, as any movement from the building is not directly transmitted to the mounting structure, or vice versa.

Many embodiments are related to a mounting structure for attaching a solar panel module to a mounting surface. The mounting structure includes a mounting base for coupling the solar panel to the mounting surface. The mounting base includes at least one aperture. A sacrificial material sheet is included for coupling to the mounting base and between the mounting surface. The sacrificial material sheet can have at least one mounting pin with a fastening end. At least one flange is included to mate with the fastening end of the at least one mounting pin. The at least one mounting pin is adapted to protrude through the at least one aperture such that the mounting base is free to slide over the sacrificial material sheet about the at least one mounting pin, but as limited by the at least one aperture and the at least one flange.

Many embodiments are related to a method for mounting the solar energy panel mounting structure, of the various embodiments described above, to a mounting surface. The steps of the method include providing a mounting base, coupling a sacrificial material to the mounting base, fastening at least one flange to at least one mounting pin that protrudes from the sacrificial material, coupling the solar panel to the mounting base and them mounting the solar panel to the mounting surface. As provided further herein, the mounting base has at least one aperture and at least one mounting pin is adapted to protrude through the at least one aperture such that the mounting base is free to slide over the sacrificial material sheet about the at least one mounting pin as limited by the at least one aperture and the at least one flange.

In many embodiments, the method for mounting a solar energy panel to a mounting surface also includes coupling a solar panel to the mounting base and, mounting the solar panel to the mounting surface.

In many embodiments, the mounting base comprises a tray. In various embodiments, the at least one flange cannot fit through the aperture in any orientation. In alternative embodiments the flange can only fit through the aperture in specific predetermined orientations. Further, in various embodiments, the at least one flange has a cross-sectional area larger than the cross-sectional area of the at least one aperture.

In many embodiments, the fastening end of the at least one mounting pin protrudes a predetermined distance vertically from the sacrificial material sheet such that mounting base can vertically travel the predetermined distance when the at least one flange is installed on the at least one mounting pin.

In various embodiments, the sacrificial sheet material increases in thickness in a conical shape about the at least one mounting pin. Further, the sacrificial sheet material has two faces and one or both the faces can be either smooth or textured.

In many embodiments, the mounting base can have at least one mounting tab extending outward and the at least aperture can be located in the at least one mounting base. Additionally, in many embodiments, the end trays of the mounting base can have a cross-sectional profile of any one of, a hollow square, T-shape, U-shape, L-shape and I-shape.

For a further understanding of the nature and advantages of the invention, reference should be made to the following description taken in conjunction with the accompanying figures. It is to be expressly understood, however, that each of the figures is provided for the purpose of illustration and description only and is not intended as a definition of the limits of the embodiments of the present invention.

BRIEF DESCRIPTION OF THE DRAWINGS

FIG. 1 is a profile view of a ballast mounting structure with interiorly fastened connecting pins to the sacrificial material representing one example of the present invention.

FIG. 2 is an enlarged view of a section of FIG. 1 representing the interiorly fastened connecting pins.

FIG. 3 is a profile view of FIG. 1 representing the ability of the ballast mounting structure to move a limited distance in the X, Y, and Z planes without moving the sacrificial material.

FIG. 7 is a profile view of a flange mounting structure fastened with connecting pins to the sacrificial material representing one example of the present invention.

FIG. 8 is a profile view of a box mounting structure with exteriorly fastened connecting pins to the sacrificial material representing one example of the present invention.

DETAILED DESCRIPTION OF SELECTED EMBODIMENTS

Figure 4:
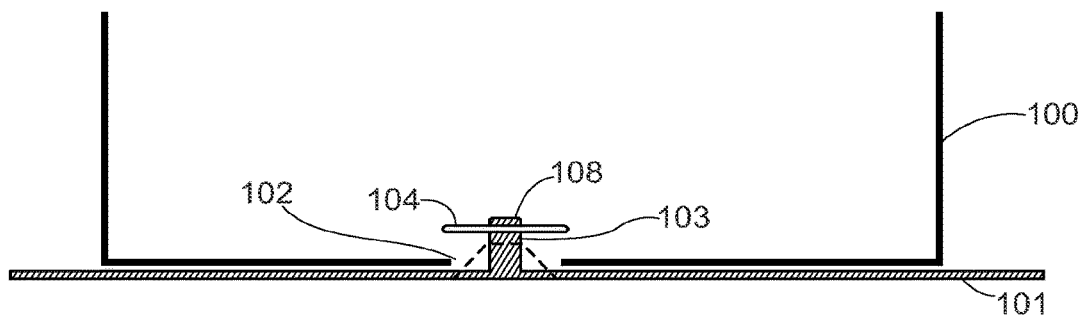
FIG. 4 is an end view of a ballast mounting structure representing one example of the present invention.

FIG. 1 is a view of a ballast mounting structure 100 connected with the sacrificial material 101. The sacrificial material 101 may be smooth or textured on one or both faces in order to achieve proper coefficients of friction between the roof membrane and sacrificial material 101, and/or between the sacrificial material 101 and ballast mounting structure 100. A cut-out 107 is included in the sacrificial material 101 to allow for drainage of liquids, such as water, to flow under the ballast mounting structure 100. In other embodiments, there may be one or more cut-outs 107. A connecting flange 106 allows for the ballast mounting structure 100 to connect with other structures, such as a solar panel (e.g. solar photovoltaic or solar water thermal panel), solar panel module mounting structure, or other structures.

FIG. 2 is an enlarged view of a section of FIG. 1. The sacrificial material 101 includes at least one mounting pin 103 that protrudes vertically through ballast mounting structure 100 through a respective hole 102. Attached to the top of mounting pin 103 is a flange surface 104, such as a washer. This flange surface 104 may be mechanically attached to mounting pin 103 by a nut 108, or similar method such as a weld, cotter pin, slip ring, or similar securing device. The flange surface 104 is large enough in area, or shaped properly such that it will not fit through hole 102 in any orientation or only in specific predetermined orientations. The distance between mounting pin 103 and the edge of hole 102 in the ballast mounting structure 100 is large enough such that the sacrificial material 101 and ballast mounting structure 100 can move independently from one another some distance, typically 0-4 inches in the X and Y direction. The flange surface 104 is some distance Z above ballast mounting structure 100 such that ballast mounting structure 100 can be lifted vertically a distance Z without lifting the sacrificial material 101. Tab 105 protrudes vertically out of ballast mounting structure 100 a sufficient distance to prevent any obstructions from interfering with the movement of the mounting pin 103 and flange surface 104 structure. For example, concrete bricks may be placed as ballast in the ballast mounting structure 100, whereby the tab 105 would prevent the concrete brick from interfering with the movement of mounting pin 103 and flange surface 104.

FIG. 3 is a view of FIG. 1 showing the limited X and Y movement between ballast mounting structure 100 and sacrificial material 101. Sacrificial material 101 remains stationary on the rooftop membrane while the ballast mounting structure 101 freely moves some distance X and Y.

FIG. 4 is a sectional end view of FIG. 1. Ballast mounting structure 100 rests on sacrificial material 101. Mounting pin 103 is mechanically affixed to sacrificial material 101 and protrudes through hole 102 in the ballast mounting structure 100. Surface flange 104 is affixed to mounting pin 103, with surface flange 104 spaced some distance X away from ballast mounting structure 100 such that some limited movement is provided. In some embodiments, sacrificial material 101 may increase in thickness in a conical shape around mounting pin 103, as shown by the dashed lines. This conical shape may help re-center the ballast mounting structure on the sacrificial material through the natural force of gravity.

Figure 5:
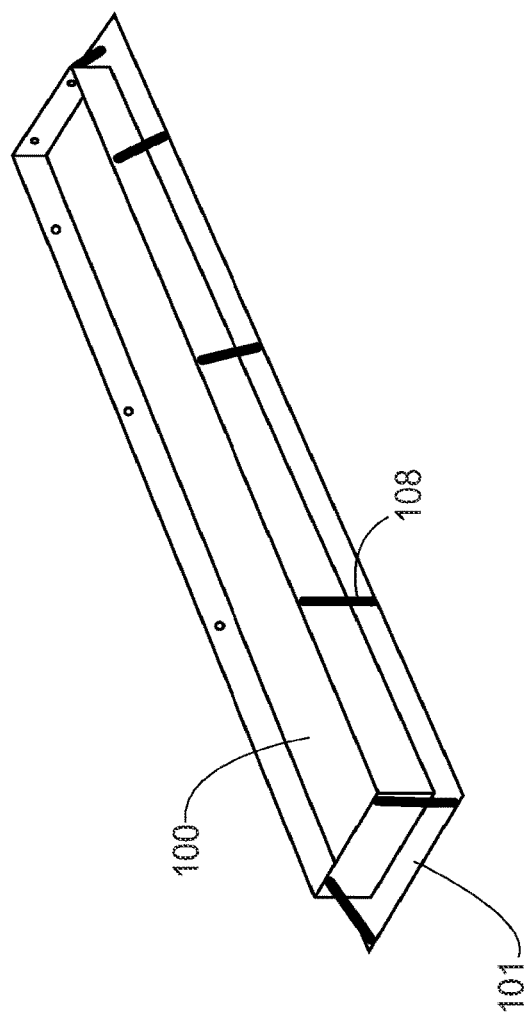
FIG. 5 is a profile view of a ballast mounting structure with exteriorly fastened connecting rods to the sacrificial material representing one example of the present invention.

FIG. 5 depicts an alternative embodiment where the sacrificial material 101 is connected to the exterior of the ballast mounting structure 100. One example of this attachment is using connecting rods 108, or chains, ropes, plastic tubes, springs, or similar devices from the ballast mounting structure to the sacrificial material. In another example, the sacrificial material has molded legs protruding upwards and connecting to the ballast mounting structure. Any number of connecting devices, or a combination of types of connecting devices, can be used.

Figure 6:
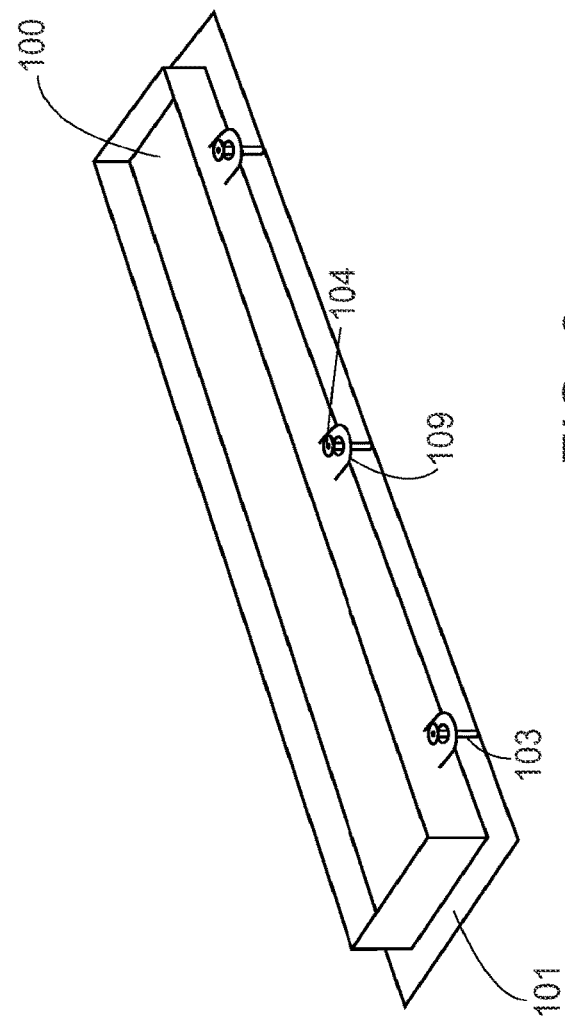
FIG. 6 is a profile view of a ballast mounting structure with exteriorly fastened connecting pins to the sacrificial material representing one example of the present invention.

FIG. 6 depicts a second alternative exterior connection method between the sacrificial material 101 and the ballast mounting structure 100. In this example, the mounting pins 103 protrude from the sacrificial material through an externally facing tab 109 attached to the ballast mounting structure 100. This externally facing tab has holes through which the mounting pins 103 protrude, and each mounting pin has a surface flange 104 affixed to the top of the mounting pin 103. Each surface flange 104 is shaped properly (e.g. circular) or large enough in size such that it will not pass through a respective hole. Additionally, the holes are large enough such that the ballast mounting structure 100 and sacrificial material 101 can move independently of one another some limited distance in the X, Y, and Z directions. The holes on the externally facing tab 109 are spaced far enough from the side of the ballast mounting structure 100 such that the surface flange 104 will not collide with the ballast mounting structure 100 at any point when the ballast mounting structure 100 and sacrificial material 101 move independently of one another. Any number of externally facing tabs 109 and associated mounting pins 103 and surface flanges 104 can be used.

FIG. 7 depicts a flange mounting structure 200 with the sacrificial material 101 connected using mounting pin 103 and surface flange 104 assemblies. This embodiment may be used to provide additional support for a roof structure where no ballast is needed, but some protection for the roof membrane is still required. The vertical flange 201 allows for mounting of equipment and support structures, such as those used in rooftop solar installations, in a variety of fashions, such as welds, bolts, clips, glues, magnets, screws, and similar connecting methods. Similar to the ballast mounting structure 100 described earlier and seen in FIG. 1, the flange mounting structure 200 is connected to the sacrificial material 101 such that there is free and independent movement from one another some limited distance. The sacrificial material 101 may be attached to the flange mounting structure 200 in ways similarly described above for FIG. 5, with the same key result being the ability for the flange mounting structure 200 and sacrificial material 101 to freely move independently of one another a limited distance in all spatial directions. FIG. 6 depicts a "T" shape flange mounting structure as one example, where other examples include an "L" shape flange, "U" shape beam, "S" shape beam, "I" shape beam, and other shaped beams and flanges. Additional, different shaped flanges and beams can also be used.

FIG. 8 depicts a box mounting structure 300 with the sacrificial material 101 connected using mounting pin 103 and surface flange 104 assemblies. Similar to the flange mounting structure 200 in FIG. 6, the box mounting structure 300 in FIG. 7 may be used to provide additional support for a roof structure where no ballast is needed, but where some protection for the roof membrane is still required. The box mounting structure 300 may have end caps, flanges, hooks, rings, pins, or similar structures affixed via welds, screws, glue, or similar as a mount to attach equipment, such as photovoltaic modules. The mounting pins 103 may protrude through the bottom wall of the box mounting structure 300, or may protrude through both bottom and top walls of the box mounting structure 300 as shown in FIG. 7. In other embodiments, the sacrificial material 101 may be attached to the box mounting structure 300 using any of the methods described for FIG. 5.

Figure 9:
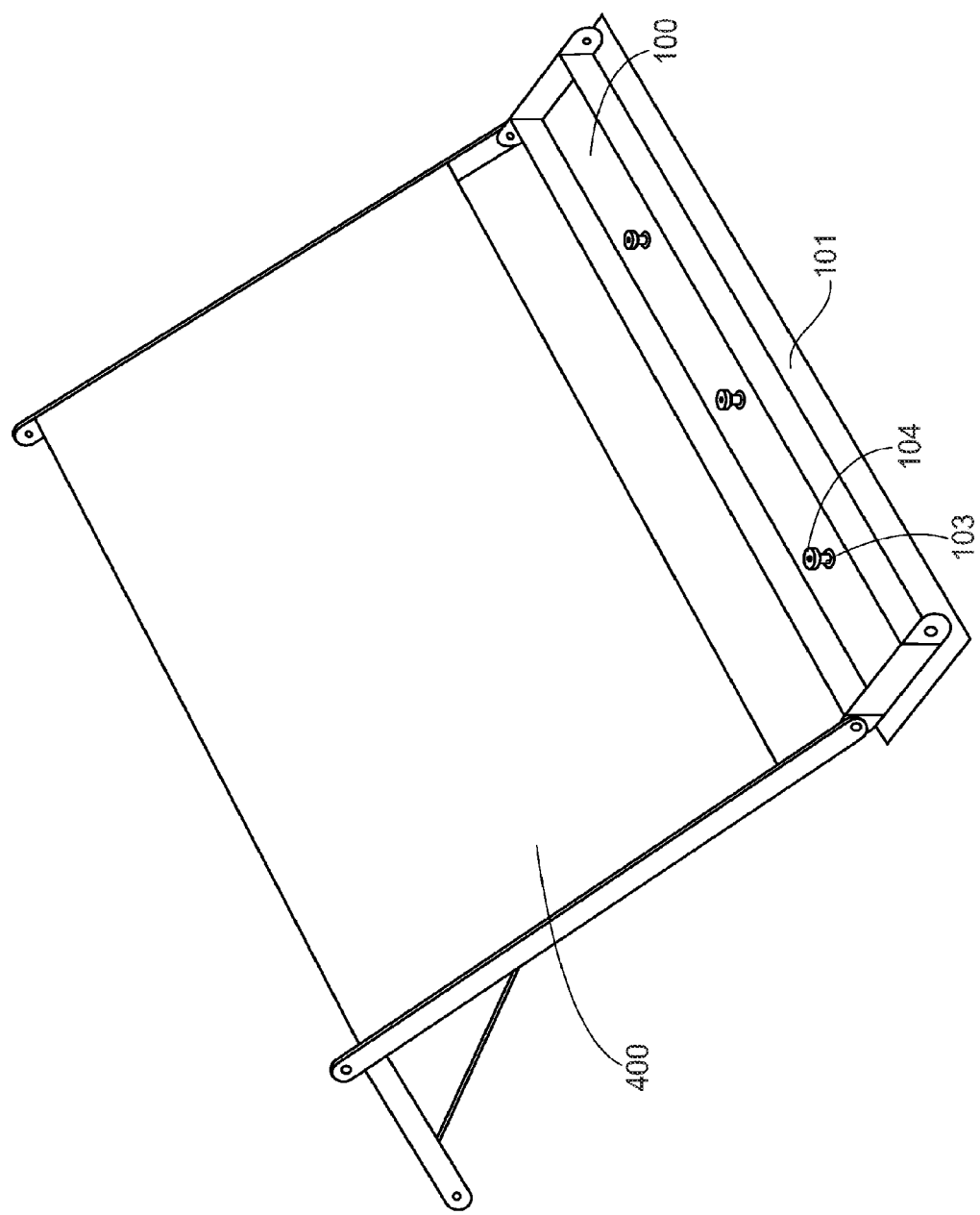
FIG. 9 is a profile view of a ballast mounting structure installed on an exemplary solar photovoltaic module assembly.

FIG. 9 depicts an example use of the ballast mounting structure 100 whereby an integrated solar energy module and mounting frame 400 is connected to the ballast mounting structure 100. In this example usage of the present invention, the ballast mounting structure 100 is connected to the sacrificial material 101 using internal mounting pin 103 and surface flange 104 assemblies. The sacrificial material extends beyond the dimensions of the ballast mounting structure 100 and width of the mounting frame 400 in order to protect the roof membrane in all configurations and orientations of the sacrificial material 101.

Figure 10:
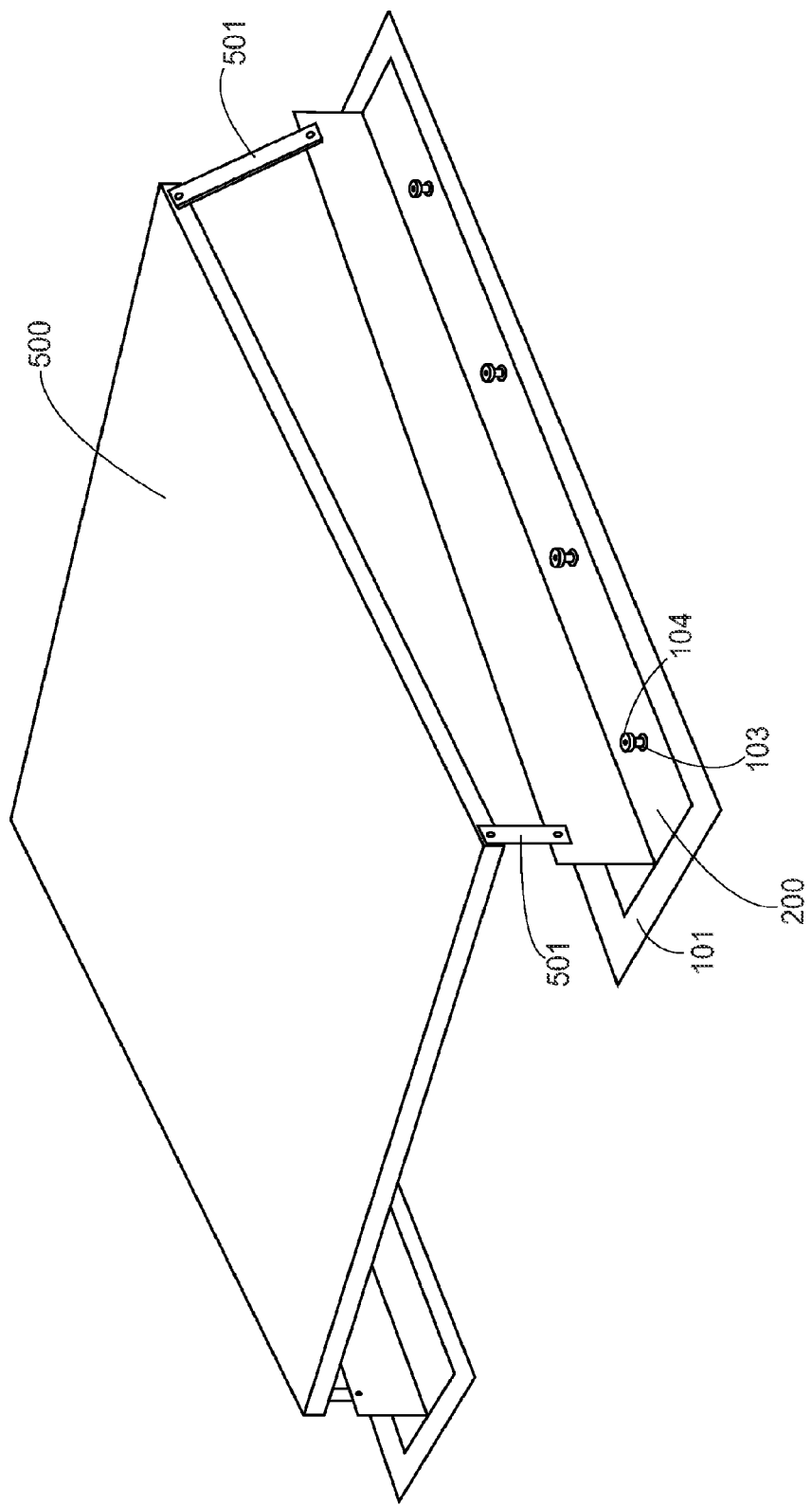
FIG. 10 is a profile view of a flange mounting structure installed on an exemplary solar photovoltaic module assembly.

FIG. 10 depicts an example use of the flange mounting structure 200 whereby a photovoltaic module 500 and supporting mounting frames 501 connect to the flange mounting structure 200. In this example, the flange mounting structure 200 is connected to the sacrificial material 101 using mounting pin 103 and surface flange 104 assemblies. Other pieces of equipment could use the flange mounting structure 200, such as electrical conduit, plumbing, weather devices, fiber optic cable, and other similar components often found on a roof.

Figure 11:
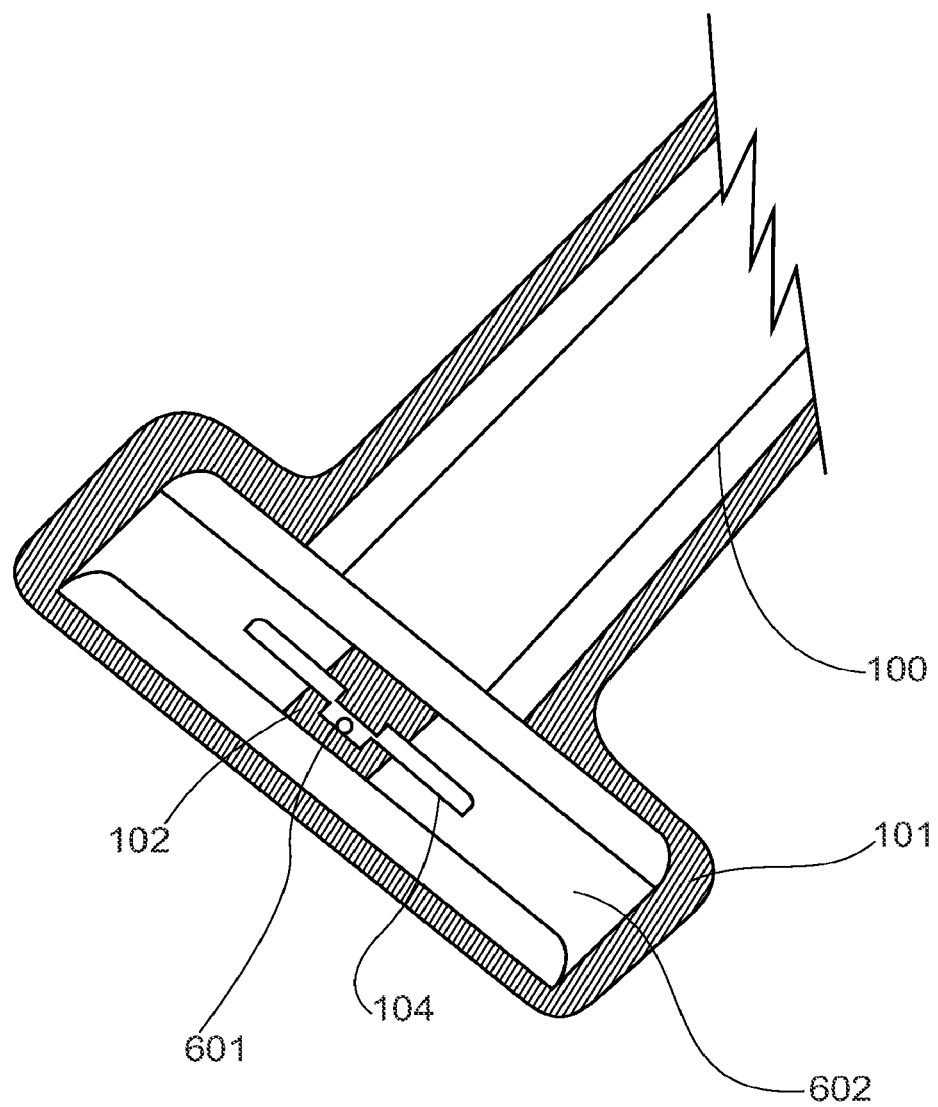
FIG. 11 is a profile view of a ballast mounting structure connected with the sacrificial material.

FIG. 11 is a view of an alternative embodiment of a ballast mounting structure 100 connected with the sacrificial material 101. The ballast mounting structure 100 includes two end trays 602 that act as the connection tabs for receiving a correspondingly configured mounting part of a solar panel (not shown). The flange surface 104 may be connected to the sacrificial material 101 using a rivet 601, or similar connecting device such as a screw, glue, pin, staple, or similar securing device. The flange surface 104 extends vertically on either side of rivet 601 such that flange surface 104 does not interfere with end tray 602. The flange surface 104 can be configured to only pass through hole 102 in certain orientations. The distance between the edges of the hole 102 and flange surface 104 is large enough to allow for end tray 602 to move some limited distance in the X, Y, and Z directions.

Figure 12:
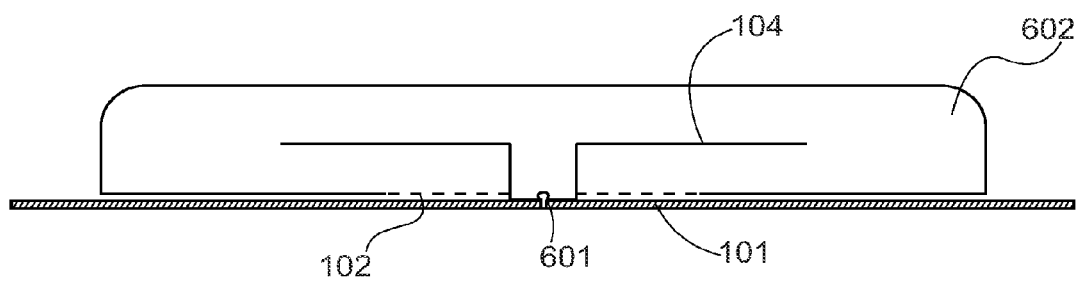
FIG. 12 is a perspective view showing a portion of the ballast mounting structure of FIG. 11.

FIG. 12 is a perspective view of a portion of the ballast mounting structure 100. As shown, the end trays 602 rest on the sacrificial material 101. The flange surface 104 is mechanically affixed to sacrificial material 101 with rivet 601 in this particular illustration. The lower horizontal surface where flange surface 104 is secured at rivet 601 is dimensioned to provide proper support for rivet 601. The hole 102 is wide enough to allow for the end tray 602 to move some limited distance in the X direction. Further, the flange surface 104 has a vertical distance above the lower surface of end tray 602 to allow for end tray 602 to move some limited distance in the positive Y direction.

In the claims appended hereto, the term "a" or "an" is intended to mean "one or more." While the exemplary embodiments have been described in some detail for clarity of understanding and by way of example, a number of modifications, changes, and adaptations may be implemented and/or will be obvious to those as skilled in the art. Hence, the scope of the present invention is limited solely by the claims as follows.

The invention claimed is:

1. A mounting structure comprising:
 a mounting base configured to hold a ballast weight and to couple a solar panel assembly to a mounting surface, the mounting base having at least one aperture;
 a sheet assembly for coupling to the mounting base having at least one mounting flange, the mounting flange comprising:
  at least one support arm extending substantially orthogonally away from the sheet assembly, and
  a flange ridge on a terminal end of the at least one support arm; and
 wherein a length of the flange ridge and a height of the at least one support arm are adapted to allow the mounting flange to be inserted through the at least one aperture in specific predetermined orientations;
 wherein the mounting base is free to move about the sheet assembly as limited by the at least one aperture and the mounting flange; and
 wherein the flange ridge prevents the mounting base from being removed from the sheet assembly except in the specific predetermined orientations.

2. The mounting structure of claim 1, wherein the mounting base comprises a ballast tray configured to hold the ballast weight.

3. The mounting structure of claim 1, wherein the at least one support arm protrudes a predetermined distance vertically from the sheet assembly before terminating in the flange ridge such that the mounting base can vertically travel the predetermined distance.

4. The mounting structure of claim 1, wherein the sheet assembly has a first face and a second face, the second face being opposite the first face and wherein the sheet assembly is smooth or textured on one or both the first and second face.

5. The mounting structure of claim 1, wherein the mounting base has least one mounting tab extending outward for preventing the ballast weight from interfering with the mounting flange.

6. The mounting structure of claim 1, wherein the mounting base has at least two mounting tabs, and wherein the at least one aperture is located between the mounting tabs.

7. The mounting structure of claim 1, wherein the mounting base has a cross-sectional profile of one of, a hollow square, T-shaped, V-shaped, L-shaped, and I-shape.

8. A method for mounting a solar energy panel mounting structure to a mounting surface comprising:
  providing a mounting base configured to hold a ballast weight and to couple a solar panel assembly to a mounting surface, the mounting base having at least one aperture; and
  coupling a sheet assembly to the mounting base, the sheet assembly having at least one mounting flange, the at least one mounting flange comprising at least one support arm extending substantially orthogonally away from the sheet assembly, and a flange ridge on a terminal end of the at least one support arm,
  wherein a length of the flange ridge and a height of the at least one support arm are adapted to allow the mounting flange to be inserted through the at least one aperture in specific predetermined orientations;
  wherein the mounting base is free to move about the sheet assembly as limited by the at least one aperture and the mounting flange; and
  wherein the flange ridge prevents the mounting base from being removed from the sheet assembly except in the specific predetermined orientations.

9. The method for mounting a solar energy panel to a mounting surface of claim 8, further comprising coupling a solar panel assembly to the mounting base and, mounting the solar panel assembly to the mounting surface.

10. The method for mounting a solar energy panel to a mounting surface of claim 8, wherein the mounting base has at least two apertures, a first end, a second end opposite the first end, and an end tray on both the first and second end, wherein one of the at least two apertures are respectively located in each end tray.

11. The method for mounting a solar energy panel to a mounting surface of claim 10, further comprising placing a ballast weight in each end tray.

12. The method for mounting a solar energy panel to a mounting surface of claim 8, wherein the at least one support arm protrudes a predetermined distance vertically from the sheet assembly before terminating in the flange ridge such that the mounting base can vertically travel the predetermined distance.

13. The method for mounting a solar energy panel to a mounting surface of claim 8, wherein the sheet assembly has a first face and a second face, the second face being opposite the first face and wherein the sheet assembly is smooth or textured on one or both the first and second face.

14. The method for mounting a solar energy panel to a mounting surface of claim 8, wherein the mounting base has least one mounting tab extending outward for preventing the ballast weight from interfering with the mounting flange.

15. The method for mounting a solar energy panel to a mounting surface of claim 8, wherein the mounting base has at least two mounting tabs, and wherein the at least one aperture is located between the mounting tabs.

16. The method for mounting a solar energy panel to a mounting surface of claim 8, wherein the mounting base has a cross-sectional profile of one of, a hollow square, T-shaped, V-shaped, L-shaped, and I-shape.

* * * * *